(12) United States Patent
Kuang et al.

(10) Patent No.: US 10,613,179 B2
(45) Date of Patent: Apr. 7, 2020

(54) METHOD AND APPARATUS FOR MAGNETIC RESONANCE IMAGING PREVIEW AND ESTABLISHING AN MR MODEL FOR THE PREVIEW

(71) Applicant: Siemens Healthcare GmbH, Erlangen (DE)

(72) Inventors: Bin Kuang, Shenzhen (CN); Chao Ming He, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 14 days.

(21) Appl. No.: 15/891,784

(22) Filed: Feb. 8, 2018

(65) Prior Publication Data
US 2018/0231628 A1 Aug. 16, 2018

(30) Foreign Application Priority Data
Feb. 10, 2017 (CN) .......................... 2017 1 0072578

(51) Int. Cl.
| | |
|---|---|
| *G01R 33/54* | (2006.01) |
| *G06T 5/00* | (2006.01) |
| *G06T 7/00* | (2017.01) |
| *G01R 33/561* | (2006.01) |
| *G01R 33/565* | (2006.01) |
| *G01R 33/56* | (2006.01) |

(52) U.S. Cl.
CPC ....... *G01R 33/543* (2013.01); *G01R 33/5608* (2013.01); *G01R 33/5614* (2013.01); *G01R 33/56536* (2013.01); *G06T 5/002* (2013.01); *G06T 5/009* (2013.01); *G06T 7/0012* (2013.01); *G06T 2207/10088* (2013.01); *G06T 2207/20182* (2013.01); *G06T 2207/30024* (2013.01)

(58) Field of Classification Search
CPC .............. G01R 33/543; G01R 33/5608; G01R 33/5614; G01R 33/56536; G01R 33/48; G06T 5/009; G06T 7/0012; G06T 5/002; G06T 2207/10088; G06T 2207/30024; G06T 2207/20182; A61B 5/055
See application file for complete search history.

(56) References Cited

U.S. PATENT DOCUMENTS

| | | | | |
|---|---|---|---|---|
| 4,945,478 A | * | 7/1990 | Merickel | ................ A61B 5/055 382/131 |
| 6,823,205 B1 | * | 11/2004 | Jara | ........................ G01R 33/50 324/307 |
| 7,782,507 B2 | | 8/2010 | Matsumoto | |

\* cited by examiner

*Primary Examiner* — G. M. A Hyder
(74) *Attorney, Agent, or Firm* — Schiff Hardin LLP

(57) ABSTRACT

In a method and apparatus for magnetic resonance imaging preview and establishing an MR model, an MRI scanner is controlled so as to execute an MR model scan sequence to perform an MRI scan of a designated patient, to obtain an MR model of the patient. One type of scan sequence is sequentially selected from all types of scan sequence supported by the MRI device, and one parameter set is sequentially selected from at least one parameter set supported by this type of scan sequence. The selected sequence and the selected parameter set are used to subject the MR model to a virtual MRI scan, to obtain an MR preview image corresponding to the selected sequence and the selected parameter set for the sequence C. This is repeated for all types of scan sequence supported by the MRI scanner and all parameter sets supported by each type of scan sequence. An MR model of a patient can thereby be established, and MR images of the patient to be previewed quickly, before an MRI scan of the patient is actually begun.

12 Claims, 12 Drawing Sheets

METHOD AND APPARATUS FOR MAGNETIC RESONANCE IMAGING PREVIEW AND ESTABLISHING AN MR MODEL FOR THE PREVIEW

BACKGROUND OF THE INVENTION

Field of the Invention

The present application concerns the technology of MRI (Magnetic Resonance Imaging), and in particular concerns an MRI preview method and apparatus, and a method and apparatus for establishing an MR (Magnetic Resonance) model.

Description of the Prior Art

In MRI, a radio frequency (RF) pulse of a specific frequency is radiated into a human body in a static magnetic field, such that hydrogen protons in the human body are excited and experience the phenomenon of magnetic resonance. When the pulse ceases, the protons emit MR (magnetic resonance) signals in the course of their relaxation. An MR image is created by spatially encoding the MR signals and reconstructing image data therefrom, for the purpose of displaying an image represented by the image data.

The MR image has grayscale characteristics. The stronger the MR signal, the greater the brightness. If the MR signal is weak, the brightness is likewise low. These brightness levels are represented in the image by a grayscale value range from white and gray to black.

MRI is used for imaging diagnosis of various systems throughout the body. MR image grayscale characteristics for various types of tissue are as follows: fat tissue and cancellous bone appear white; brain, spinal cord and bone marrow appear whitish gray; internal organs and muscles appear grayish white; liquid and blood flowing at normal speed appear black; cortical bone, gas and bubble-containing lungs appear black.

Commonly used MRI scan pulse sequences include:

1) SE (Spin-Echo Sequence)

First a 90° excitation pulse is emitted, then a 180° phase refocusing pulse is emitted after an interval of a few milliseconds to a few tens of milliseconds, then an echo signal is measured after a few tens of milliseconds. Thus, there is only one 180° pulse in one TR (repetition time). This is called a spin echo sequence (SE), and is a classic sequence in MR imaging. There are three types of weighted imaging with an SE sequence:

A. PD (Proton Density) Weighted Image

Parameters: long TR=1500-2500 ms, short TE (echo time)=15-30 ms; the amplitude of the echo signal acquired is mainly related to proton density, so this type of image is called a PD weighted image.

B. T2 (Transverse Relaxation Time) Weighted Image

Parameters: long TR=1500-2500 ms, long TE=90-120 ms; the amplitude of the echo signal acquired mainly reflects differences in the T2 of tissues, so this type of image is called a T2 weighted image.

C. T1 (Longitudinal Relaxation Time) Weighted Image

Parameters: short TR=about 500 ms, short TE=15-30 ms; the amplitude of the echo signal acquired mainly reflects differences in the T1 of tissues, so this type of image is called a T1 weighted image.

2) TSE (Turbo Spin-Echo Sequence)

The TSE sequence is a sequence built on the foundation provided by the SE sequence. First of all a 90° excitation pulse is emitted, then multiple 180° phase refocusing pulses in the same direction are emitted, to form an echo train (ETL, Echo Train Length), thereby shortening the scan time. This is called a turbo spin echo sequence (TSE).

3) GRE (Gradient-Echo Sequence)

This is MR imaging using gradient echo. Gradient echo is similar to spin echo. The generation of a spin echo uses a 180° complex phase pulse. With regard to gradient echo generation, forward/reverse switching of the readout gradient field direction is used after one RF excitation to generate a gradient echo.

4) EPI (Echo Planar Imaging)

This is currently the fastest sequence in MR imaging. The MR signal is also a gradient echo. Unlike ordinary gradient echo, after one RF excitation, successive forward/reverse switching of the readout gradient field is utilized, and one gradient echo is generated each time switching is performed, therefore there is an echo train, similar to TSE.

Before an MRI scan of a patient is started, the MRI operator generally wishes to know which type of sequence should be used, and which values should be chosen for the parameters of the sequence used, in order to obtain an optimal MR image of the patient. At present, there is no satisfactory solution to this issue.

SUMMARY OF THE INVENTION

An object of the invention is to address the abovementioned problem, an MRI preview method that enables an MR image of a patient to be previewed before an MRI scan of the patient is begun. This object also is achieved in accordance with the invention by an MRI preview apparatus that enables an MR image of a patient to be previewed before an MRI scan of the patient is begun, and a method for establishing an MR model in order to obtain an MR model needed for an MR preview image, and an apparatus for establishing an MR model in order to obtain an MR model needed for an MR preview image.

In accordance with the invention, in an MRI preview method, an MR model scan sequence is preset in a computer, all types of scan sequence supported by an MRI device are pre-saved by the computer, and at least one parameter set supported by each type of scan sequence is set in the computer. Further in accordance with the invention, the MRI device is controlled by the computer so as to use the MR model scan sequence to perform an MRI scan of a designated patient, in order to obtain an MR model of the patient. One type of scan sequence is sequentially selected from all the types of scan sequence supported by the MRI device, and one parameter set is sequentially selected from at least one parameter set supported by this type of scan sequence, and the selected sequence and the selected parameter set are used to subject the MR model to a virtual MRI scan, in order to obtain an MR preview image corresponding to the selected sequence and the selected parameter set for the sequence. This sequence selection is repeated until it has been performed for all types of scan sequence supported by the MRI device and all parameter sets supported by each type of scan sequence.

After controlling the MRI device to use the MR model scan sequence to perform the MRI scan of the designated patient but before obtaining the MR model of the patient, the method further includes subjecting an MR image obtained by the MRI scan to remove noise and contrast enhancement.

After controlling the MRI device to use the MR model scan sequence to perform the MRI scan of the designated patient, but before obtaining the MR model of the patient, the method further includes calculating a signal strength of each type of tissue of a human body under the MR model scan sequence, according to an MR characteristic parameter of each type of tissue of the human body and a scan characteristic parameter of the MR model scan sequence. Then the calculated signal strength of each type of tissue of the human body under the MR model scan sequence is individually mapped to a brightness interval of an MR image. A tissue is then determined to which each pixel point on the MR image obtained by the MRI scan belongs, according to the mapped signal strength of each type of tissue of the human body under the MR model scan sequence. The MR model is represented as an identifier of the tissue to which each pixel point on the MR image obtained by the MRI scan belongs, and a position of the pixel point.

In an embodiment, using the selected sequence and the selected parameter set to subject the MR model to the virtual MRI scan includes performing a Bloch algorithm based on the identifier of the tissue to which each pixel point belongs in the MR model, the MR characteristic parameter of that tissue, and the position of the pixel point, and also on the basis of the selected sequence and the selected parameter set for the sequence, and a field non-homogeneity description matrix of a current static magnetic field, so as to obtain the MR preview image corresponding to the selected sequence and the selected parameter set for the sequence.

The set MR model scan sequence can be a True Fast Imaging with Steady State Precession (TrueFISP) sequence, or a Constructive Interference in Steady State (CISS) sequence, or a Reverse Fast Imaging with Steady State Precession (PSIF) sequence.

The present invention also encompasses a method for establishing an MR model that includes controlling an MRI device to use a preset MR model scan sequence to perform an MRI scan of a designated patient and calculating a signal strength of each type of tissue of a human body under the MR model scan sequence, according to an MR characteristic parameter of each type of tissue of the human body and a scan characteristic parameter of the MR model scan sequence. The method further includes individually mapping the calculated signal strength of each type of tissue of the human body under the MR model scan sequence to a brightness interval of an MR image, and determining a tissue to which each pixel point on the MR image obtained by the MRI scan belongs, according to the mapped signal strength of each type of tissue of the human body under the MR model scan sequence. Also in the method, an MR model of the patient is established on the basis of the tissue to which each pixel point on the MR image obtained by the MRI scan belongs, and a position of the pixel point.

After controlling the MRI device to use the preset MR model scan sequence to perform the MRI scan of the designated patient, but before calculating the signal strength of each type of tissue of the human body under the MR model scan sequence, the method further includes subjecting an MR image obtained by the MRI scan to noise removing and contrast enhancement.

An MRI preview computer according to the invention includes an MR model establishing processor that controls an MRI apparatus in order to use a preset MR model scan sequence to perform an MRI scan of a designated patient, so as to obtain an MR model of the patient.

The computer also includes a virtual scan processor that pre-saves all types of scan sequences supported by the MRI device, and sets at least one parameter set supported by each type of scan sequence and sequentially selects one type of scan sequence from all of the types of scan sequence supported by the MRI device, and sequentially selects one parameter set from at least one parameter set supported by this type of scan sequence. The virtual scan processor uses the selected sequence and the selected parameter set to subject the MR model to a virtual MRI scan, in order to obtain an MR preview image corresponding to the selected sequence and the selected parameter set for the sequence, until the virtual MRI scan of the MR model has been performed for all types of scan sequence supported by the MRI device and all parameter sets supported by each type of scan sequence.

After controlling the MRI device to use the preset scan sequence to perform the MRI scan of the designated patient, but before obtaining the MR model of the patient, the MR model establishing processor subjects an MR image obtained by the MRI scan to noise removal (noise cleansing), and subjects the noise removed MR image to contrast enhancement.

After controlling the MRI apparatus to use the preset MR model scan sequence to perform the MRI scan of the designated patient, but before obtaining the MR model of the patient, the MR model establishing processor calculates a signal strength of each type of tissue of a human body under the MR model scan sequence, according to an MR characteristic parameter of each type of tissue of the human body and a scan characteristic parameter of the MR model scan sequence, and individually maps the calculated signal strength of each type of tissue of the human body under the MR model scan sequence to a brightness interval of an MR image. The MR model establishing processor determines a tissue to which each pixel point on the MR image obtained by the MRI scan belongs, according to the mapped signal strength of each type of tissue of the human body under the MR model scan sequence. The MR model establishing processor then represents the MR model as an identifier of the tissue to which each pixel point on the MR image obtained by the MRI scan belongs, and a position of the pixel point.

In an embodiment, the virtual scan processor uses the selected sequence and the selected parameter set to subject the MR model to the virtual MRI scan by performing a Bloch algorithm, on the basis of the identifier of the tissue to which each pixel point belongs in the MR model, the MR characteristic parameter of said tissue and the position of the pixel point, and also on the basis of the selected sequence and the selected parameter set for the sequence, and a field non-homogeneity description matrix of a current static magnetic field, so as to obtain the MR preview image corresponding to the selected sequence and the selected parameter set for the sequence.

The MR model scan sequence used by the MR model establishing processor can be a True Fast Imaging with Steady State Precession (TrueFISP) sequence, or a Constructive Interference in Steady State (CISS) sequence, or a Reverse Fast Imaging with Steady State Precession (PSIF) sequence.

An MRI apparatus has an MR data acquisition scanner that is controlled by an MRI preview computer as described above.

The MRI apparatus can operate according to any or all or the embodiments described above.

By first establishing an MR model of a patient, then using each type of sequence supported by an MRI device and multiple parameter sets for each type of sequence to perform virtual MRI scans, so as to obtain multiple representative MR preview images for each type of sequence supported by the MRI device, MR images of the patient are previewed before an MRI scan of the patient is actually begun, thereby making it easy for medical personnel to find the scan sequence with the best imaging result for an examination region of each patient.

Moreover, by selecting a scan sequence with a fast scanning speed and obvious imaged tissue features as an MR model scan sequence, the speed at which the MR model is established is increased, thereby increasing the imaging speed of the MR preview image, and improving the user experience.

Moreover, by running a virtual MRI scan algorithm on a GPGPU, the imaging speed of the MR preview image is further increased, further improving the user experience.

BRIEF DESCRIPTION OF THE DRAWINGS

FIG. 3-1 is an MR image obtained by performing an MRI scan of a patient's abdomen using a TrueFISP sequence in the process of establishing an MR model, in an embodiment of the present application.

FIG. 3-2 is an MR image obtained by subjecting the MR image shown in FIG. 3-1 to Winner filtering.

FIG. 3-3 is an MR image obtained by subjecting the MR image shown in FIG. 3-2 to histogram equalization.

FIG. 3-4 is a histogram of the MR image shown in FIG. 3-1.

FIG. 3-5 is a histogram of the MR image shown in FIG. 3-2.

FIG. 4 is a flowchart of a method in an embodiment of the present application, for subjecting an MR model to a virtual MRI scan to obtain an MR preview image.

FIG. 5-1 is an MR preview image obtained by using an embodiment of the present application to perform a virtual MRI scan of a patient's abdomen using SE with TE=100 ms and TR=2000 ms.

FIG. 5-2 is an MR image obtained by using an embodiment of the present application to perform a virtual MRI scan of a patient's abdomen using GRE with TE=100 ms, TR=2000 ms and deflection angle=60°.

FIG. 5-3 is an MR image obtained by using an embodiment of the present application to perform a virtual MRI scan of a patient's abdomen using TSE with TE=192 ms, TR=2000 ms and echo train length=256.

FIG. 6-1 is a T1-weighted MR amplitude image obtained by using an embodiment of the present application to perform a virtual MRI scan of a patient's head using an SE sequence with TE=25.0 ms and TR=500.0 ms.

FIG. 6-2 is a T1-weighted MR phase image obtained by using an embodiment of the present application to perform a virtual MRI scan of a patient's head using an SE sequence with TE=25.0 ms and TR=500.0 ms.

FIG. 6-3 is a T1-weighted MR amplitude image obtained by performing a real MRI scan of a patient's head using an SE sequence with TE=25.0 ms and TR=500.0 ms.

FIG. 7-1 is a T2-weighted MR amplitude image obtained by using an embodiment of the present application to perform a virtual MRI scan of a patient's head using an SE sequence with TE=100.0 ms and TR=2000.0 ms.

FIG. 7-2 is a T2-weighted MR phase image obtained by using an embodiment of the present application to perform a virtual MRI scan of a patient's head using an SE sequence with TE=100.0 ms and TR=2000.0 ms.

FIG. 7-3 is a T2-weighted MR amplitude image obtained by performing a real MRI scan of a patient's head using an SE sequence with TE a 100.0 ms and TR=2000.0 ms.

FIG. 8-1 is a PD-weighted MR amplitude image obtained by using an embodiment of the present application to perform a virtual MRI scan of a patient's head using an SE sequence with TE=22.0 ms and TR=2000.0 ms.

FIG. 8-2 is a PD-weighted MR phase image obtained by using an embodiment of the present application to perform a virtual MRI scan of a patient's head using an SE sequence with TE=22.0 ms and TR=2000.0 ms.

FIG. 8-3 is a PD-weighted MR amplitude image obtained by performing a real MRI scan of a patient's head using an SE sequence with TE=22.0 ms and TR=2000.0 ms.

DESCRIPTION OF THE PREFERRED EMBODIMENTS

Figure 1:
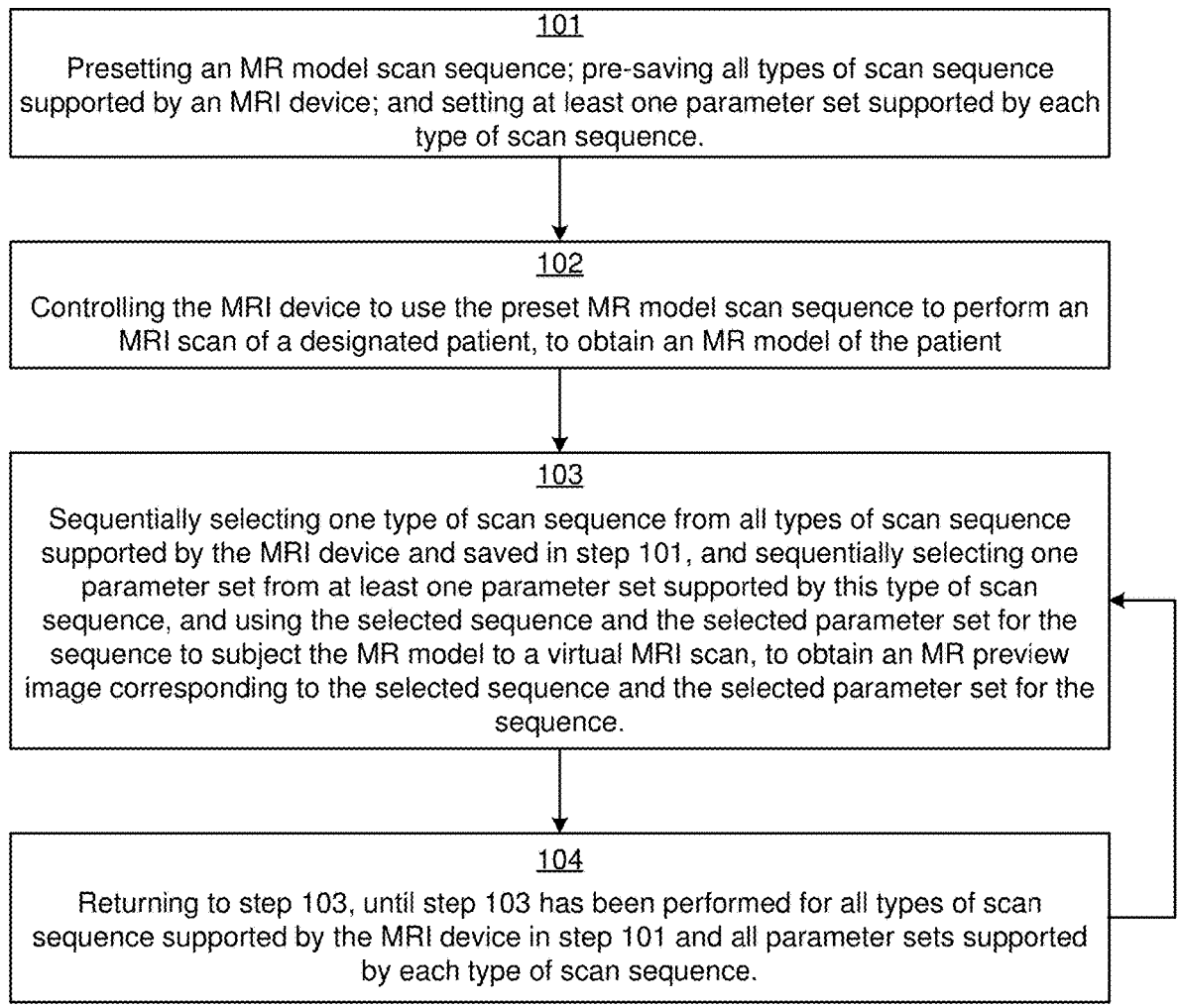
FIG. 1 is a flow chart of an MRI preview method in an embodiment of the present application.

To explain the objects, technical solution and advantages of the present application, the present application is explained in detail below on the basis of embodiments with reference to the accompanying drawings.

For example, "a" and "the" in the singular form used in the description of the present application and the attached claims are also intended to include the plural form, unless clearly specified otherwise herein.

In an MRI preview method provided in an embodiment of the present application, an MR model scan sequence is preset. All types of scan sequence supported by an MRI device are pre-saved, and at least one parameter set supported by each type of scan sequence is set. This takes place as follows.

The MRI device is controlled to use the MR model scan sequence to perform an MRI scan of a designated patient, to obtain an MR model of the patient.

One type of scan sequence is sequentially selected from all types of scan sequence supported by the MRI device, and one parameter set is sequentially selected from at least one parameter set supported by this type of scan sequence, and the selected sequence and the selected parameter set are used to subject the MR model to a virtual MRI scan, to obtain an MR preview image corresponding to the selected sequence and the selected parameter set for the sequence.

The above selections are performed for all types of scan sequence supported by the MRI device and all parameter sets supported by each type of scan sequence.

In actual application, after controlling the MRI device to use the MR model scan sequence to perform the MRI scan of the designated patient but before obtaining the MR model of the patient, the method further includes subjecting an MR image obtained by the MRI scan to noise removal and contrast enhancement.

In actual application, after controlling the MRI device to use the MR model scan sequence to perform the MRI scan of the designated patient but before obtaining the MR model of the patient, the method further includes calculating a signal strength of each type of tissue of a human body under the MR model scan sequence, according to an MR characteristic parameter of each type of tissue of the human body and a scan characteristic parameter of the MR model scan sequence.

This is followed by individually mapping the calculated signal strength of each type of tissue of the human body under the MR model scan sequence to a brightness interval of an MR image.

This is followed by determining a tissue to which each pixel point on the MR image obtained by the MRI scan belongs, according to the mapped signal strength of each type of tissue of the human body under the MR model scan sequence.

The MR model is represented as an identifier of the tissue to which each pixel point on the MR image obtained by the MRI scan belongs, and a position of the pixel point.

In actual application, using the selected sequence and the selected parameter set to subject the MR model to the virtual MRI scan includes performing a Bloch algorithm, on the basis of the identifier of the tissue to which each pixel point belongs in the MR model, the MR characteristic parameter of the tissue and the position of the pixel point, and also on the basis of the selected sequence and the selected parameter set for the sequence, and a field non-homogeneity description matrix of a current static magnetic field, to obtain the MR preview image corresponding to the selected sequence and the selected parameter set for the sequence.

In actual application, the set MR model scan sequence is a True Fast Imaging with Steady State Precession (True-FISP) sequence, or a Constructive Interference in Steady State (CISS) sequence, or a Reverse Fast Imaging with Steady State Precession (PSIF) sequence.

In actual application, the calculation steps can be performed by a general-purpose computing graphics processing unit (GPGPU), as long as it is specially programmed in order to be able to operate in accordance with the invention.

An embodiment of the present application also provides a method for establishing an MR model that includes controlling an MRI device to use a preset MR model scan sequence to perform an MRI scan of a designated patient, and calculating a signal strength of each type of tissue of a human body under the MR model scan sequence, according to an MR characteristic parameter of each type of tissue of the human body and a scan characteristic parameter of the MR model scan sequence. This embodiment of the method further includes individually mapping the calculated signal strength of each type of tissue of the human body under the MR model scan sequence to a brightness interval of an MR image.

This embodiment further includes determining a tissue to which each pixel point on the MR image obtained by the MRI scan belongs, according to the mapped signal strength of each type of tissue of the human body under the MR model scan sequence, and establishing an MR model of the patient on the basis of the tissue to which each pixel point on the MR image obtained by the MRI scan belongs, and a position of the pixel point.

In actual application, after controlling the MRI device to use the preset MR model scan sequence to perform the MRI scan of the designated patient, but before calculating the signal strength of each type of tissue of the human body under the MR model scan sequence, this embodiment of the method further includes subjecting an MR image obtained by the MRI scan to noise removing and contrast enhancement.

FIG. 1 is a flow chart of an MRI preview method provided in an embodiment of the present application; the main steps thereof are as follows:

Step 101: an MR model scan sequence is preset; all types of scan sequence supported by an MRI device are pre-saved, and at least one parameter set supported by each type of scan sequence is set.

The MR model scan sequence should satisfy the following conditions: the scanning speed is fast, and the features of each type of tissue reflected by the MR image obtained by scanning are cleanly shown, e.g.: sequences such as True-FISP (True Fast Imaging with Steady State Precession), CISS (Constructive Interference in Steady State), PSIF (Reverse Fast Imaging with Steady State Precession).

The types of scanning sequence supported by the MRI device, and adjustable parameters of each type of sequence, may be as follows:

1) SE

Adjustable parameters: TE, TR, FoV (Field of View), BW (BandWidth, receiver bandwidth);

2) TSE

Adjustable parameters: echo train length, TE, TR, FoV;

3) GRE

Adjustable parameters: deflection angle, TE, TR, FoV, BW;

4) EPI

Adjustable parameters: echo train length, TE, TR, FoV.

In particular application, multiple types of sequence may be selected from the abovementioned sequences as required, and multiple parameter sets supported by each type of sequence may be set.

For multiple parameter sets supported by each type of sequence, the value of each parameter in each parameter set therein may be set on the basis of experience, etc. There may be one or more parameters whose value varies in the different parameter sets.

Of course, in the case of one parameter, variation of the parameter may also be realized by setting an initial value, a final value and a variation step length of the parameter.

Step 102: controlling the MRI device to use the preset MR model scan sequence to perform an MRI scan of a designated patient, to obtain an MR model of the patient.

Step 103: sequentially selecting one type of scan sequence from all types of scan sequence supported by the MRI device and saved in step 101, and sequentially selecting one parameter set from at least one parameter set supported by this type of scan sequence, and using the selected sequence and the selected parameter set for the sequence to subject the MR model to a virtual MRI scan, to obtain an MR preview image corresponding to the selected sequence and the selected parameter set for the sequence.

Step 104: returning to step 103, until step 103 has been performed for all types of scan sequence supported by the MRI device in step 101 and all parameter sets supported by each type of scan sequence.

Figure 2:
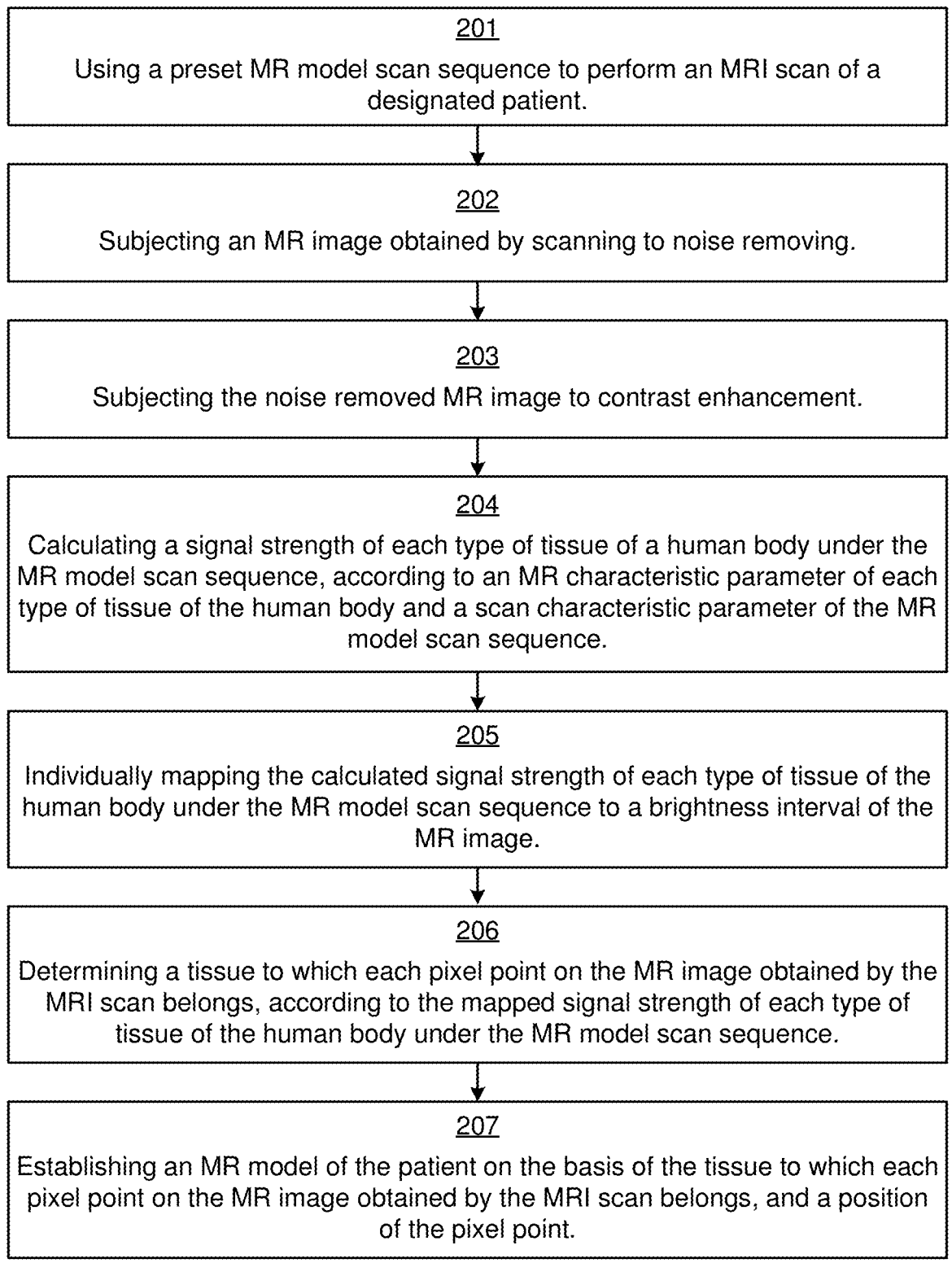
FIG. 2 is a flowchart of a method for establishing an MR model, in an embodiment of the present application.

FIG. 2 is a flow chart of a method for establishing an MR model provided in an embodiment of the present application, with the following specific steps:

Step 201: using a preset MR model scan sequence to perform an MRI scan of a designated patient.

The MR model scan sequence should satisfy the following conditions: the scanning speed is fast, and the features of each type of tissue reflected by an MR image obtained by scanning are obvious, e.g.: sequences such as TrueFISP, CISS and PSIF.

Step 202: subjecting an MR image obtained by scanning to noise removing.

Noise removing may be realized using an algorithm such as winner filtering or homomorphic filtering.

Step 203: subjecting the noise removed MR image to contrast enhancement.

Contrast enhancement may be realized using an algorithm such as histogram equalization or MUSICA (Multi-Scale Image Contrast Amplification).

Figures 1, 3:
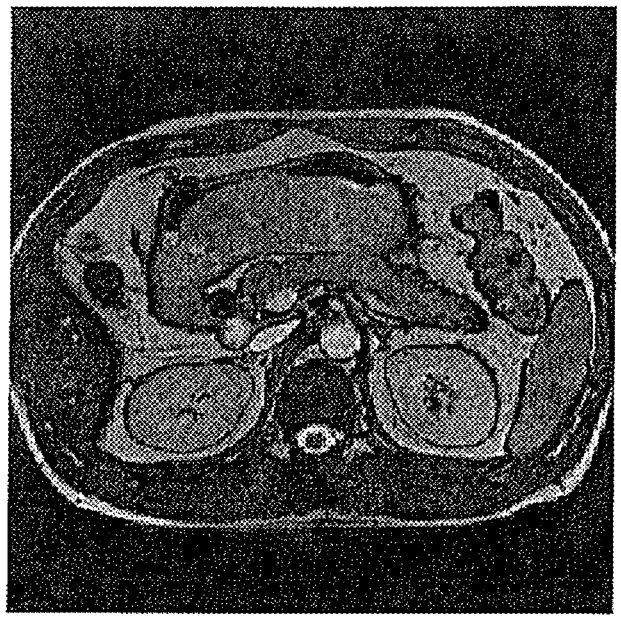
Figures 2, 3:
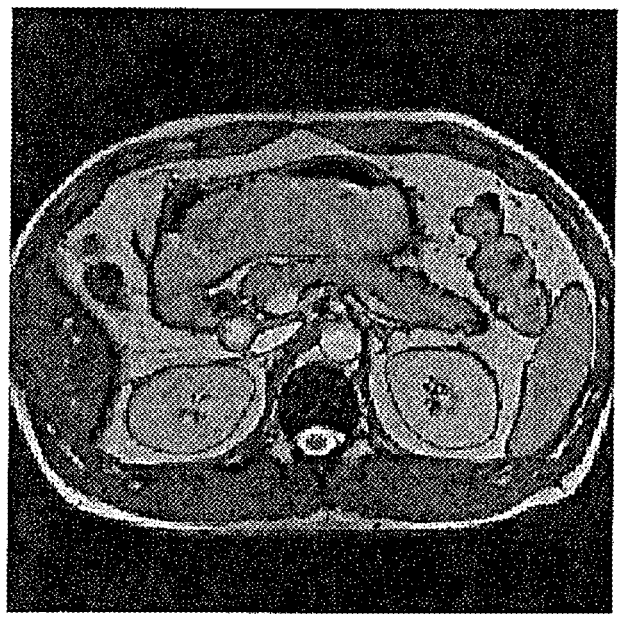
Figure 3:
Figures 3, 4:
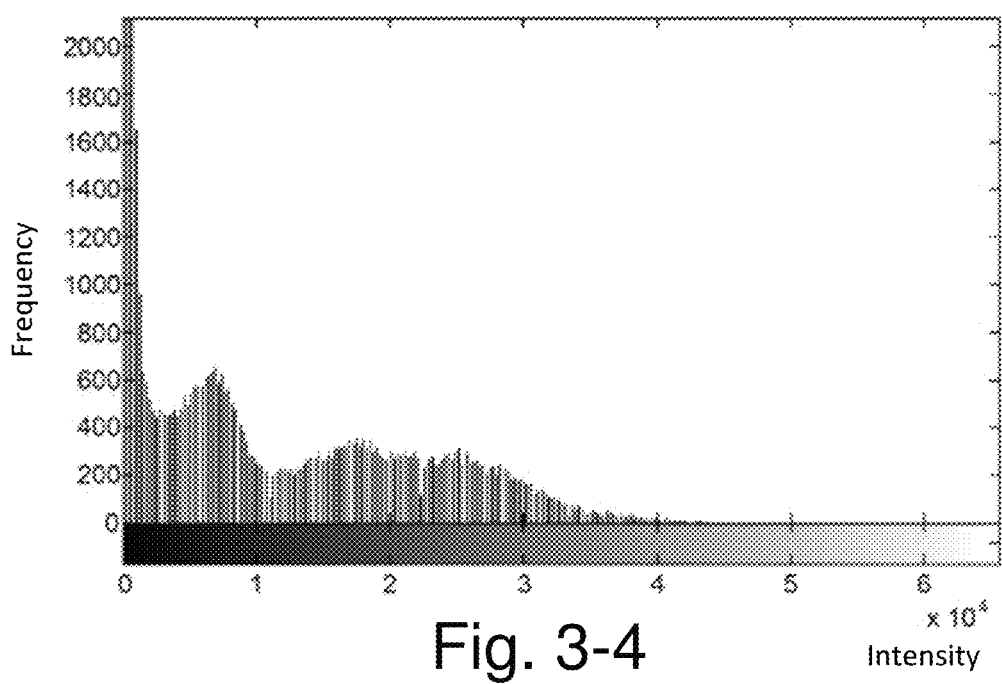
Figures 3, 4, 5:
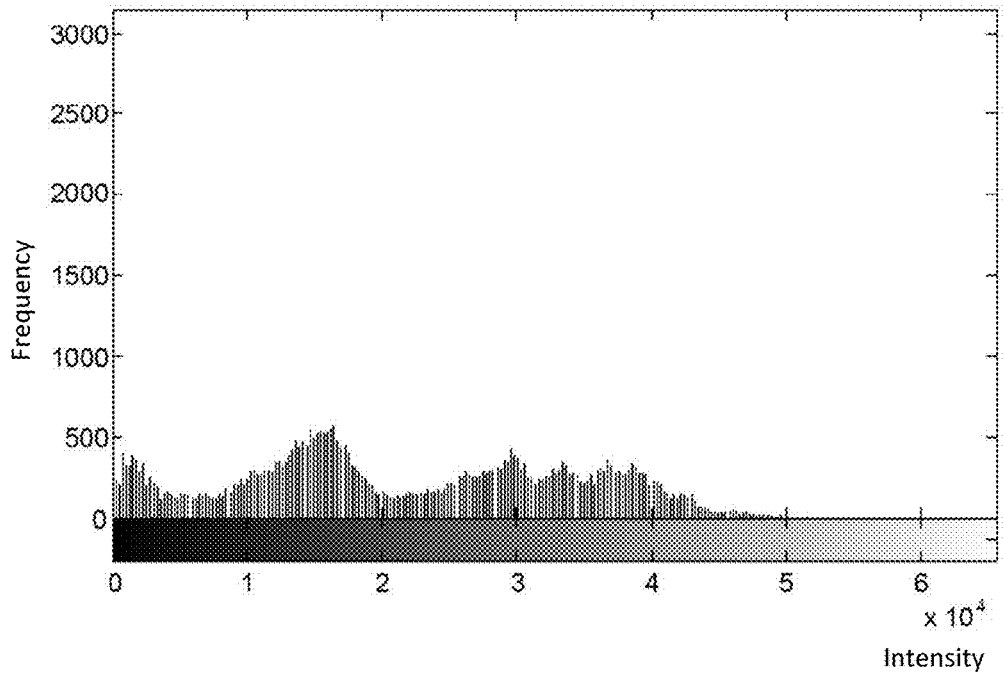
Figure 4:
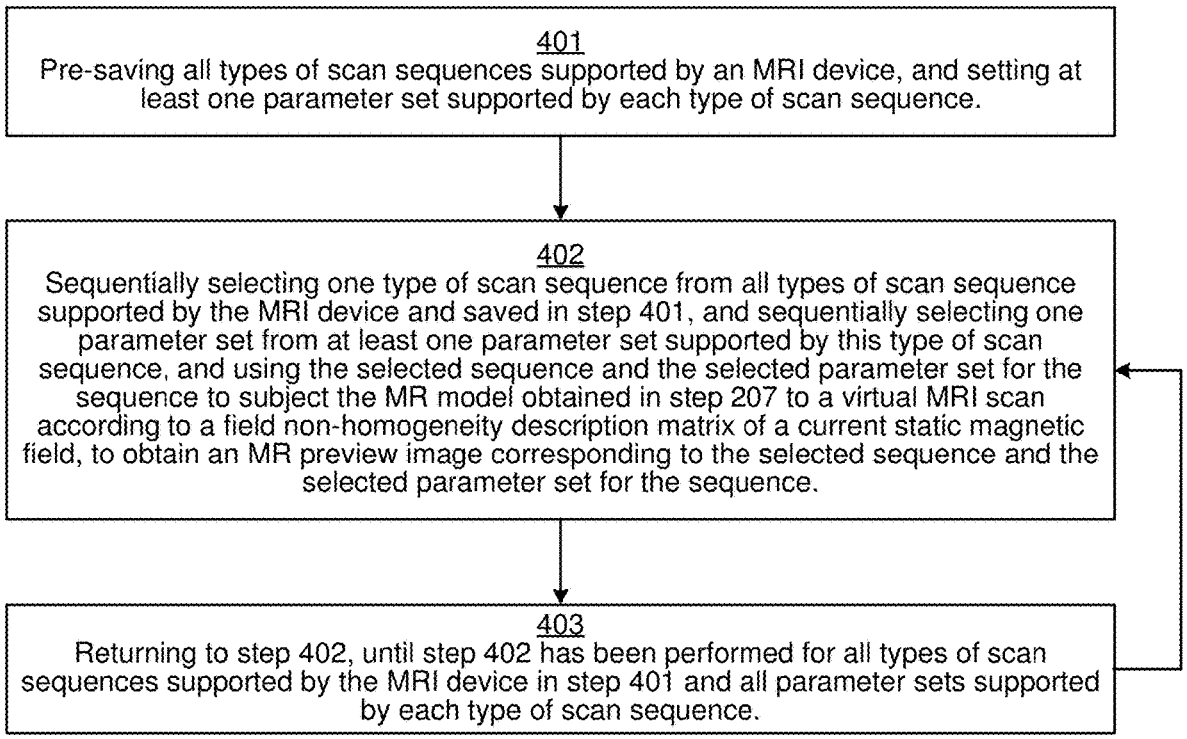
Figures 1, 5:
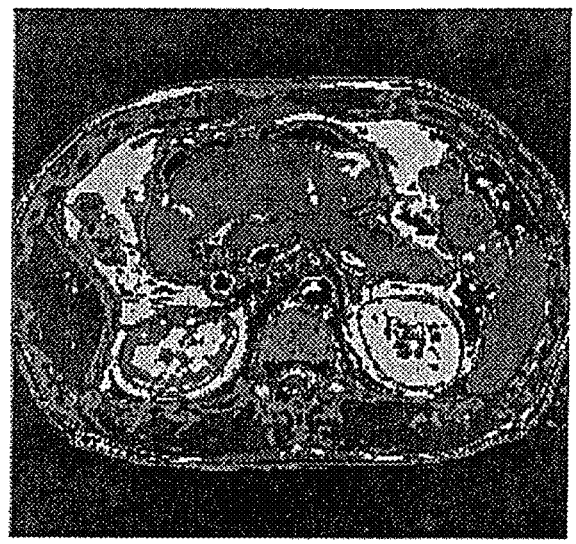
Figures 2, 5:
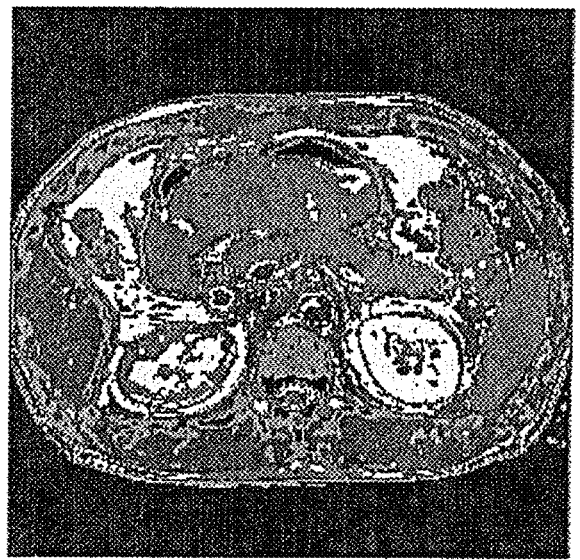
Figures 3, 5:

If the MR model scan sequence used in step 201 is a TrueFISP sequence:

FIG. 3-1 is an MR image obtained by performing an MRI scan of a patient's abdomen using the TrueFISP sequence;

FIG. 3-2 is an MR image obtained by subjecting the MR image shown in FIG. 3-1 to winner filtering;

FIG. 3-3 is an MR image obtained by subjecting the MR image shown in FIG. 3-2 to histogram equalization;

FIG. 3-4 is a histogram of the MR image shown in FIG. 3-1;

FIG. 3-5 is a histogram of the MR image shown in FIG. 3-2.

By comparing FIGS. 3-5 and 3-4, it can be seen that after winner filtering, noise in the MR image has obviously been removed, and it can be seen by comparing FIGS. 3-3 and 3-1 that after winner filtering and histogram equalization, the contrast of the MR image is obviously enhanced.

Step 204: calculating a signal strength of each type of tissue of a human body under the MR model scan sequence, according to an MR characteristic parameter of each type of tissue of the human body and a scan characteristic parameter of the MR model scan sequence.

For example: if the MR model scan sequence used in step 201 is a TrueFISP sequence, a formula for calculating the signal strength S of each type of tissue of the human body under the TrueFISP sequence is as follows:

$$S = M_0 \frac{(1 - e^{-TR/T1})\sin\alpha}{1 - e^{-TR/T1}\cos\alpha - e^{-TR/T2}(e^{-TR/T1} - \cos\alpha)} \quad (1)$$

where $M_0$ is proton density of tissue of the human body, T1 is longitudinal relaxation time of tissue of the human body, T2 is transverse relaxation time of tissue of the human body, $\alpha$ is deflection angle of the TrueFISP sequence, and TR is repetition time of the TrueFISP sequence.

In view of the fact that in general, TR<<T1 and TR<<72, formula (1) above may be simplified to:

$$S = M_0 \frac{\sin\alpha}{1 + \cos\alpha + (1 - \cos\alpha)(T1/T2)} \quad (2)$$

Formula (2) above may be further simplified to:

$$S \cong \frac{1}{2} M_0 \sqrt{\frac{T_2}{T_1}} \quad (3)$$

Then the signal strength S of each type of tissue of the human body under the TrueFISP sequence can be calculated by formula (3).

Table I shows the values of MR characteristic parameters of each type of tissue of the human body, e.g. T1, T2, $M_0$ and magnetic susceptibility parameters:

TABLE 1

| Tissue type | $T_1$(ms) | $T_2$(ms) | $M_0$ | magnetic susceptibility (ppm) |
|---|---|---|---|---|
| Air (alveoli) | 0 | 0 | 0 | 0.04 |
| Connective (connective tissue) | 500 | 70 | 0.77 | −9.05 |
| CSF (colony stimulating factor) | 2569 | 329 | 1 | −9.05 |
| Fat (fat) | 350 | 70 | 1 | −7.5 |
| Glial Matter (neuroglia) | 833 | 83 | 0.86 | −9.05 |
| Gray Matter (gray matter) (of brain) | 833 | 83 | 0.86 | −9.05 |
| Muscle (muscle) | 900 | 47 | 1 | −9.5 |
| Skin (skin) | 2569 | 329 | 1 | −9.05 |
| Bone (bone) | 0 | 0 | 0 | −8.86 |
| White Matter (white matter (of brain and spinal cord)) | 500 | 70 | 0.77 | −9.05 |
| Tumor (tumor) | 926 | 53 | 1 | −9.05 |
| Liver (liver) | 490 | 43 | 1 | −9.5 |

A scan characteristic parameter of the MR model scan sequence is for example: TR, etc.

Step 205: individually mapping the calculated signal strength of each type of tissue of the human body under the MR model scan sequence to a brightness interval of the MR image.

For example: if the MR image is a grayscale image, then the signal strength of each type of tissue of the human body under the MR model scan sequence is mapped to a grayscale interval [0, 255]; the mapping method is a familiar technique, so is not described again here.

Step 206: determining a tissue to which each pixel point on the MR image obtained by the MRI scan belongs, according to the mapped signal strength of each type of tissue of the human body under the MR model scan sequence.

Step 207: establishing an MR model of the patient on the basis of the tissue to which each pixel point on the MR image obtained by the MRI scan belongs, and a position of the pixel point.

For example: if the resolution of the MR image obtained by the MRI scan is a*b, then there are a*b pixel points in total, and coordinates of each pixel point and the name of the tissue to which the pixel point belongs are recorded individually, the MR characteristic parameters of the tissue to which the pixel point belongs including T1, T2, M0 and magnetic susceptibility, etc., to form the MR model of the patient.

FIG. 4 is a flow chart of a method provided in an embodiment of the present application, for subjecting an MR model to a virtual MRI scan to obtain an MR preview image, with the following specific steps:

Step 401: all types of scan sequence supported by an MRI device are pre-saved, and at least one parameter set supported by each type of scan sequence is set.

The types of scanning sequence supported by the MRI device, and adjustable parameters of each type of sequence, may be as follows:
1) SE
Adjustable parameters: TE, TR, FoV, BW;
2) TSE
Adjustable parameters: echo train length, TE, TR, FoV;
3) GRE
Adjustable parameters: deflection angle, TE, TR, FoV, BW;
4) EPI
Adjustable parameters: echo train length, TE, TR, FoV.

In particular application, multiple types of sequence may be selected from the abovementioned sequences as required, and multiple parameter sets supported by each type of sequence may be set.

For multiple parameter sets supported by each type of sequence, the value of each parameter in each parameter set therein may be set on the basis of experience, etc. There may be one or more parameters whose value varies in the different parameter sets. Of course, in the case of one parameter, variation of the parameter may also be realized by setting an initial value, a final value and a variation step length of the parameter.

Step 402: sequentially selecting one type of scan sequence from all types of scan sequence supported by the MRI device and saved in step 401, and sequentially selecting one parameter set from at least one parameter set supported by this type of scan sequence, and using the selected sequence and the selected parameter set for the sequence to subject the MR model obtained in step 207 to a virtual MRI scan according to a field non-homogeneity description matrix of a current static magnetic field, to obtain an MR preview image corresponding to the selected sequence and the selected parameter set for the sequence.

In actual application, a Bloch algorithm may be used to subject the MR model to a virtual MRI scan. The type of sequence selected, the sequence parameters (e.g. parameters such as TE, TR, Fov and BW in the case of an SE sequence) and the coordinates of each pixel point in the MR model, the name of the tissue to which the pixel point belongs, the MR characteristic parameters of said tissue (T1, T2, $M_0$ and magnetic susceptibility, etc.) and a non-homogeneity description matrix of a current static magnetic field are inputted into the Bloch algorithm; a virtual MRI scan of the MR model using a current sequence can thus be realized, to obtain a virtual MRI scan result: an MR preview image.

Step 403: returning to step 402, until step 402 has been performed for all types of scan sequence supported by the MRI device in step 401 and all parameter sets supported by each type of scan sequence.

In actual application, to accelerate the operating speed of the virtual MRI scan, the procedure shown in FIG. 4 may be run on a GPGPU. Using the multithreading characteristic of the GPGPU, when executing the Bloch algorithm for each pixel point in the MR model, parallel execution is possible.

FIG. 5-1 is an MR preview image obtained by performing a virtual MRI scan of a patient's abdomen using SE with TE=100 ms and TR=2000 ms;

FIG. 5-2 is an MR image obtained by performing a virtual MRI scan of a patient's abdomen using GRE with TE=100 ms, TR=2000 ms and deflection angle=60°;

FIG. 5-3 is an MR image obtained by performing a virtual MRI scan of a patient's abdomen using TSE with TE=192 ms, TR=2000 ms and echo train length=256.

It can be seen from FIGS. 5-1, 5-2 and 5-3 that for the same region of the same patient, properties of the MR images obtained by performing virtual MRI scans using different types of sequence, such as contrast, are different.

Thus, before a real MRI scan of a patient is begun, the method provided in an embodiment of the present application is first used to obtain MR images of the patient for sequences of different types and sequences of the same type but different parameters, to assist medical personnel in determining which sequence gives the best MRI imaging result, so as to select the sequence with the best imaging result to perform the real MRI scan of the patient.

Figures 1, 6:
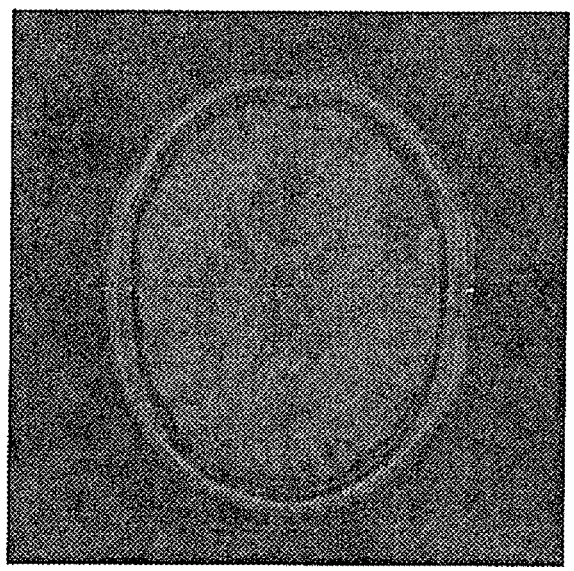
Figures 2, 6:
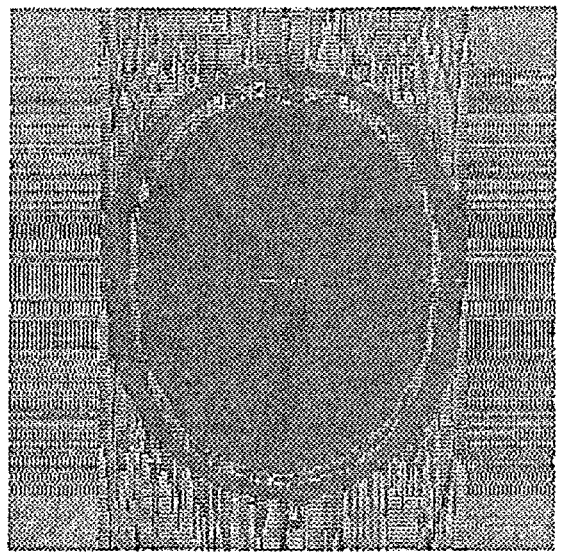
Figures 3, 6:
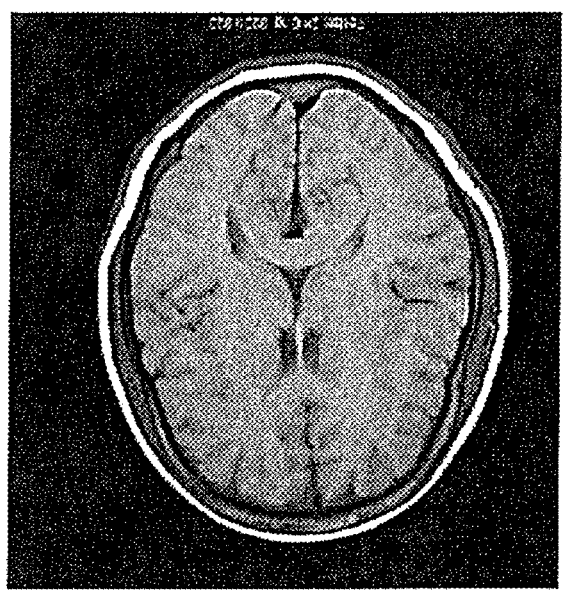
Figures 1, 7:
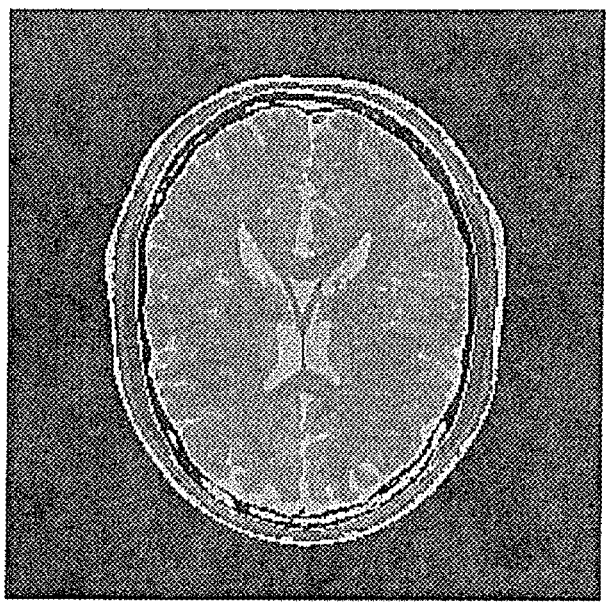
Figures 2, 7:
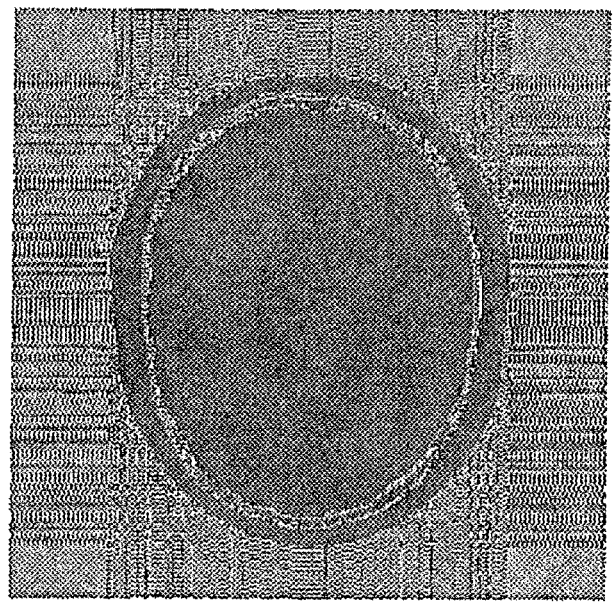
Figures 3, 7:
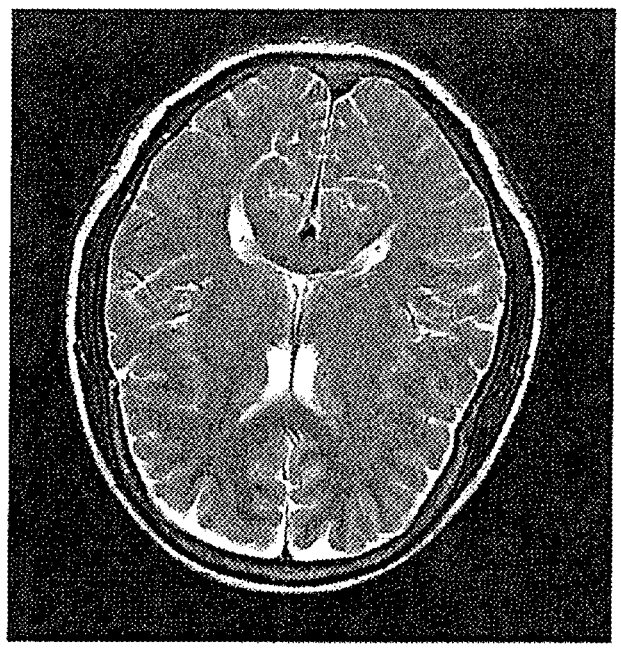

FIG. 6-1 is a T1-weighted MR amplitude image obtained by performing a virtual MRI scan of a patient's head using an SE sequence with TE=25.0 ms and TR=500.0 ms;

FIG. 6-2 is a T1-weighted MR phase image obtained by performing a virtual MRI scan of a patient's head using an SE sequence with TE=25.0 ms and TR=500.0 ms;

FIG. 6-3 is a T1-weighted MR amplitude image obtained by performing a real MRI scan of a patient's head using an SE sequence with TE=25.0 ms and TR=500.0 ms;

FIG. 7-1 is a T2-weighted MR amplitude image obtained by performing a virtual MRI scan of a patient's head using an SE sequence with TE=100.0 ms and TR=2000.0 ms;

FIG. 7-2 is a T2-weighted MR phase image obtained by performing a virtual MRI scan of a patient's head using an SE sequence with TE=100.0 ms and TR=2000.0 ms;

FIG. 7-3 is a T2-weighted MR amplitude image obtained by performing a real MRI scan of a patient's head using an SE sequence with TE=100.0 ms and TR=2000.0 ms.

Figures 1, 8:
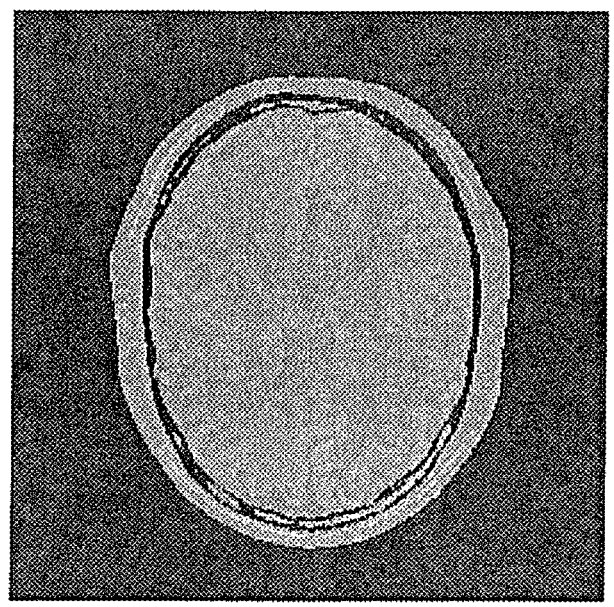
Figures 2, 8:
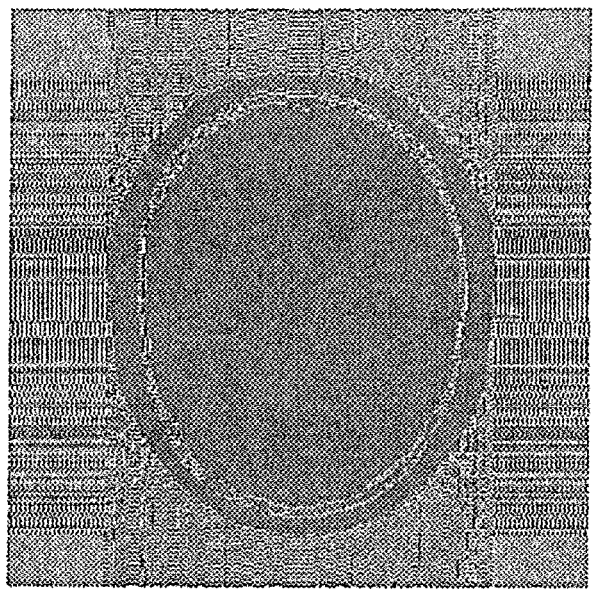
Figures 3, 8:
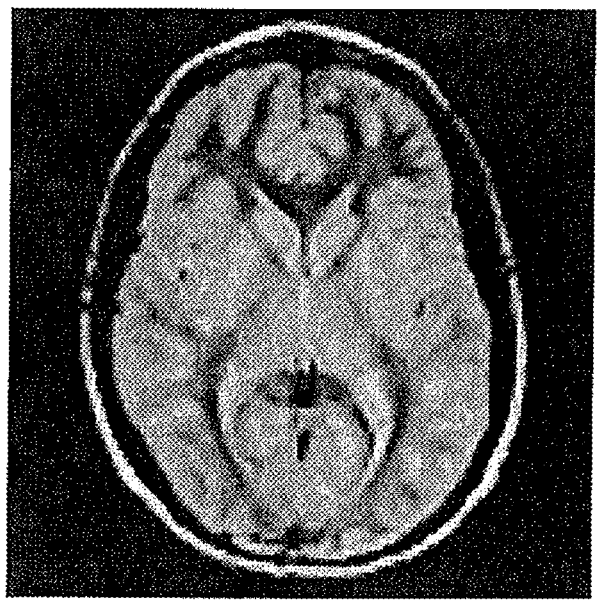

FIG. 8-1 is a PD-weighted MR amplitude image obtained by performing a virtual MRI scan of a patient's head using an SE sequence with TE=22.0 ms and TR=2000.0 ms;

FIG. 8-2 is a PD-weighted MR phase image obtained by performing a virtual MRI scan of a patient's head using an SE sequence with TE=22.0 ms and TR=2000.0 ms;

FIG. 8-3 is a PD-weighted MR amplitude image obtained by performing a real MRI scan of a patient's head using an SE sequence with TE=22.0 ms and TR=2000.0 ms.

Comparing FIGS. 6-1, 7-1 and 8-1, and comparing FIGS. 6-2, 7-2 and 8-2, it can be seen that when different parameters of the same type of sequence, an SE sequence, are used to perform virtual MRI scans of the same region of a patient, the MR images obtained have different properties. Moreover, comparing FIGS. 6-1 and 6-3, comparing FIGS. 7-1 and 7-3, and comparing FIGS. 8-1 and 8-3, it can be seen that when virtual and real MRI scans are performed using the same parameters of the same sequence, properties such as contrast of the MR images obtained are similar.

Figure 9:
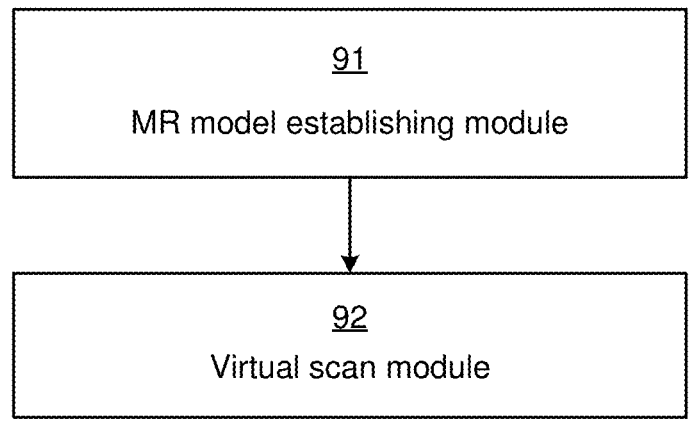
FIG. 9 is a schematic diagram of the composition of an MRI preview apparatus in an embodiment of the present application.

FIG. 9 is a schematic diagram of the composition of an MRI preview apparatus provided in an embodiment of the present application; the apparatus mainly comprises an MR model establishing module 91 and a virtual scan module 92, wherein the MR model establishing module 91: controls an MRI device to use a preset MR model scan sequence to perform an MRI scan of a designated patient, to obtain an MR model of the patient. The virtual scan module 92 pre-saves all types of scan sequence supported by the MRI device, and sets at least one parameter set supported by each type of scan sequence; sequentially selects one type of scan sequence from all types of scan sequence supported by the MRI device, and sequentially selects one parameter set from at least one parameter set supported by this type of scan sequence, and uses the selected sequence and the selected parameter set to subject the MR model obtained by the MR model establishing module 91 to a virtual MRI scan, to obtain an MR preview image corresponding to the selected sequence and the selected parameter set for the sequence, until the virtual MRI scan of the MR model has been performed for all types of scan sequence supported by the MRI device and all parameter sets supported by each type of scan sequence.

In one embodiment, after controlling the MRI device to use the preset scan sequence to perform the MRI scan of the designated patient, but before obtaining the MR model of the patient, the MR model establishing module 91 is further used for subjecting an MR image obtained by the MRI scan to noise removing, and subjecting the noise removed MR image to contrast enhancement.

In one embodiment, after controlling the MRI device to use the preset MR model scan sequence to perform the MRI scan of the designated patient, but before obtaining the MR model of the patient, the MR model establishing module 91 is further used for calculating a signal strength of each type of tissue of a human body under the MR model scan sequence, according to an MR characteristic parameter of each type of tissue of the human body and a scan characteristic parameter of the MR model scan sequence; individually mapping the calculated signal strength of each type of tissue of the human body under the MR model scan sequence to a brightness interval of an MR image; determining a tissue to which each pixel point on the MR image obtained by the MRI scan belongs, according to the mapped signal strength of each type of tissue of the human body under the MR model scan sequence and the MR model is represented as: an identifier of the tissue to which each pixel point on the MR image obtained by the MRI scan belongs, and a position of the pixel point.

In one embodiment, the step of using the selected sequence and the selected parameter set to subject the MR model to the virtual MRI scan, performed by the virtual scan module 92, comprises performing a Bloch algorithm, on the basis of the identifier of the tissue to which each pixel point belongs in the MR model, the MR characteristic parameter of said tissue and the position of the pixel point, and also on the basis of the selected sequence and the selected parameter set for the sequence, and a field non-homogeneity description matrix of a current static magnetic field, to obtain the MR preview image corresponding to the selected sequence and the selected parameter set for the sequence.

In one embodiment, the MR model scan sequence used by the MR model establishing module 91 is: a TrueFISP sequence, or a CISS sequence, or a PSIF sequence.

Figure 10:
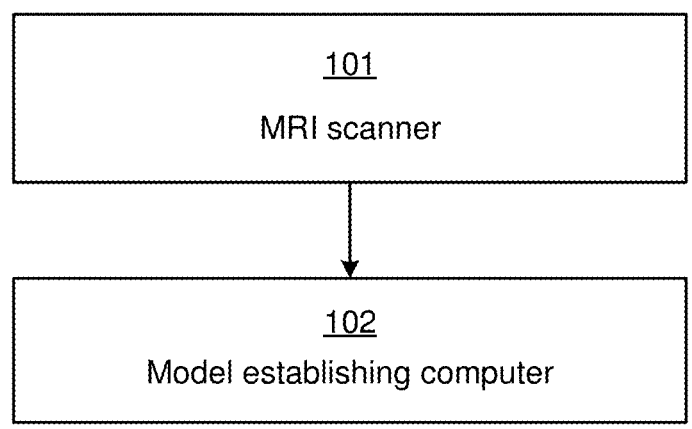
FIG. 10 is a schematic diagram of the composition of an MRI apparatus in an embodiment of the present application.

FIG. 10 is a schematic diagram of the components of an apparatus for establishing an MR model in an embodiment of the present application. The apparatus has an MRI scanner 101 and a model establishing computer 102. The MRI scanner 101 is controlled to execute a preset MR model scan sequence so as to perform an MRI scan of a designated patient, in order to obtain an MR image. The model establishing computer 102 calculates a signal strength of each type of tissue of a human body under the MR model scan sequence, according to an MR characteristic parameter of each type of tissue of the human body and a scan characteristic parameter of the MR model scan sequence; individually maps the calculated signal strength of each type of tissue of the human body under the MR model scan sequence to a brightness interval of the MR image obtained by the MRI scan module 101; determines a tissue to which each pixel point on the MR image obtained by the MRI scan module 101 belongs, according to the mapped signal strength of each type of tissue of the human body under the MR model scan sequence; and establishes an MR model of the patient on the basis of the tissue to which each pixel point on the MR image obtained by the MRI scan module 101 belongs, and a position of the pixel point.

In an embodiment, before calculating a signal strength of each type of tissue of a human body under the MR model scan sequence, the model establishing module 102 is further used for subjecting an MR image obtained by the MRI scan to noise removing and contrast enhancement.

Embodiments of the present application have the following beneficial effects:

1. By first establishing an MR model of a patient, then using each type of scan sequence supported by an MRI device and multiple parameter sets for each type of scan sequence to perform virtual MRI scans, to obtain multiple representative MR preview images for each type of scan sequence supported by the MRI device, MR images of the patient are previewed before an MRI scan of the patient is really begun, thereby making it easy for medical personnel to find the scan sequence with the best imaging result for an examination region of each patient.

2. By selecting a scan sequence with a fast scanning speed and obvious imaged tissue features as an MR model scan sequence, the speed at which the MR model is established is increased, thereby increasing the imaging speed of the MR preview image, and improving the user experience.

3. By running a virtual MRI scan algorithm on a GPGPU, the imaging speed of the MR preview image is further increased, further improving the user experience.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance imaging (MRI) preview method, wherein an MR model scan sequence is preset and all types of scan sequences supported by an MRI scanner are pre-saved, and at least one parameter set supported by each type of scan sequence is set, said method comprising:

A, using a computer to control the MRI scanner to use the MR model scan sequence to perform an MRI scan of a designated patient, to obtain an MR model of the patient, operating the MRI scanner with the set MR model scan sequence being selected from the group consisting of a True Fast Imaging with Steady State Precession (TrueFISP) sequence, and a Constructive Interference in Steady State (CISS) sequence, and a Reverse Fast Imaging with Steady State Precession (PSIF) sequence;

B, in said computer, sequentially selecting one type of scan sequence from all types of scan sequences supported by the MRI device, and sequentially selecting one parameter set from at least one parameter set supported by this type of scan sequence, and using the selected sequence and the selected parameter set to subject the MR model to a virtual MRI scan, to obtain an MR preview image corresponding to the selected sequence and the selected parameter set for the sequence; and C, repeating B, until step B has been performed for all types of scan sequence supported by the MRI scanner and all parameter sets supported by each type of scan sequence.

2. The method as claimed in claim 1, wherein after controlling the MRI device to use the MR model scan sequence to perform the MRI scan of the designated patient but before obtaining the MR model of the patient in step A, the method further comprises:

subjecting an MR image obtained by the MRI scan to noise removing and contrast enhancement.

3. The method as claimed in claim 2, wherein after controlling the MRI device to use the MR model scan sequence to perform the MRI scan of the designated patient but before obtaining the MR model of the patient in step A, the method further comprises:

calculating a signal strength of each type of tissue of a human body under the MR model scan sequence, according to an MR characteristic parameter of each type of tissue of the human body and a scan characteristic parameter of the MR model scan sequence;

individually mapping the calculated signal strength of each type of tissue of the human body under the MR model scan sequence to a brightness interval of an MR image;

determining a tissue to which each pixel point on the MR image obtained by the MRI scan belongs, according to the mapped signal strength of each type of tissue of the human body under the MR model scan sequence; and the MR model is represented as: an identifier of the tissue to which each pixel point on the MR image obtained by the MRI scan belongs, and a position of the pixel point.

4. The method as claimed in claim 3, characterized in that using the selected sequence and the selected parameter set to subject the MR model to the virtual MRI scan in step B comprises:

performing a Bloch algorithm, on the basis of the identifier of the tissue to which each pixel point belongs in the MR model, the MR characteristic parameter of said tissue and the position of the pixel point, and also on the basis of the selected sequence and the selected parameter set for the sequence, and a field non-homogeneity description matrix of a current static magnetic field, to obtain the MR preview image corresponding to the selected sequence and the selected parameter set for the sequence.

5. A method for establishing a magnetic resonance (MR) model, comprising:

controlling a magnetic resonance imaging (MRI) scanner to execute a preset MR model scan sequence in order to perform an MRI scan of a patient, operating the MRI scanner with the set MR scan sequence being selected from the group consisting of a True Fast Imaging with Steady State Precession (TrueFISP) sequence, and a Constructive Interference in Steady State (CISS) sequence, and a Reverse Fast Imaging with Steady State Precession (PSIF) sequence;

in a computer, calculating a signal strength of each type of tissue of a human body under the MR model scan sequence, according to an MR characteristic parameter of each type of tissue of the human body and a scan characteristic parameter of the MR model scan sequence;

in said computer, individually mapping the calculated signal strength of each type of tissue of the human body under the MR model scan sequence to a brightness interval of an MR image;

in said computer, determining a tissue to which each pixel point on the MR image obtained by the MRI scan belongs, according to the mapped signal strength of each type of tissue of the human body under the MR model scan sequence;

in said computer, establishing an MR model of the patient on the basis of the tissue to which each pixel point on the MR image obtained by the MRI scan belongs, and a position of the pixel point.

6. The method as claimed in claim 5, wherein, after controlling the MRI device to use the preset MR model scan sequence to perform the MRI scan of the patient, but before calculating the signal strength of each type of tissue of the human body under the MR model scan sequence, the method further comprises:

subjecting an MR image obtained by the MRI scan to noise removing and contrast enhancement.

7. A magnetic resonance imaging (MRI) preview apparatus, comprising:

an MR model establishing processor configured to control an MRI scanner to execute a preset MR model scan sequence so as to perform an MRI scan of a designated patient, in order to obtain an MR model of the patient, wherein said MR model establishing processor is configured to operate said MRI scanner with said MR model scan sequence selected from the group consisting of a true Fast Imaging with Steady State Precession (TrueFISP) sequence, and a Constructive Interference in Steady State (CISS) sequence, and a Reverse Fast Imaging with Steady State precession (PSIF) sequence; and a virtual scan processor configured to pre-save all types of scan sequence supported by the MRI scanner, and to set at least one parameter set supported by each type of scan sequence, and to sequentially select one type of scan sequence from all types of scan sequences supported by the MRI device, and to sequentially select one parameter set from at least one parameter set supported by this type of scan sequence, and to use the selected sequence and the selected parameter set to subject the MR model obtained by the MR model establishing module to a virtual MRI scan, in order to obtain an MR preview image corresponding to the selected sequence and the selected parameter set for the sequence, until the virtual MRI scan of the MR model has been performed for all types of scan sequence supported by the MRI device and all parameter sets supported by each type of scan sequence.

8. The apparatus as claimed in claim 7, wherein the MR model establishing processor, after controlling the MRI device to use the preset scan sequence to perform the MRI scan of the designated patient, but before obtaining the MR model of the patient, is further configured to subject an MR image obtained by the MRI scan to noise removal, and subject the noise removed MR image to contrast enhancement.

9. The apparatus as claimed in claim 8, wherein the MR model establishing processor, after controlling the MRI device to use the preset MR model scan sequence to perform the MRI scan of the designated patient, but before obtaining the MR model of the patient, is further configured to calculate a signal strength of each type of tissue of a human body under the MR model scan sequence, according to an MR characteristic parameter of each type of tissue of the human body and a scan characteristic parameter of the MR model scan sequence, and to individually map the calculated signal strength of each type of tissue of the human body under the MR model scan sequence to a brightness interval of an MR image; and to determine a tissue to which each pixel point on the MR image obtained by the MRI scan belongs, according to the mapped signal strength of each type of tissue of the human body under the MR model scan sequence, and to represent the MR model as an identifier of the tissue to which each pixel point on the MR image obtained by the MRI scan belongs, and a position of the pixel point.

10. The apparatus as claimed in claim 9, wherein the virtual scan processor is configured to use the selected sequence and the selected parameter set to subject the MR model to the virtual MRI scan, performed by the virtual scan module by performing a Bloch algorithm, on the basis of the identifier of the tissue to which each pixel point belongs in the MR model, the MR characteristic parameter of said tissue and the position of the pixel point, and also on the basis of the selected sequence and the selected parameter set for the sequence, and a field non-homogeneity description matrix of a current static magnetic field, in order to obtain the MR preview image corresponding to the selected sequence and the selected parameter set for the sequence.

11. An apparatus for establishing a magnetic resonance (MR) model, comprising:
- a magnetic resonance imaging (MRI) scan processor configured to control an MRI scanner to execute a preset MR model scan sequence so as to perform an MRI scan of a designated patient in order to obtain an MR image; and
- a model establishing processor configured to calculate a signal strength of each type of tissue of a human body under the MR model scan sequence, according to an MR characteristic parameter of each type of tissue of the human body and a scan characteristic parameter of the MR model scan sequence, and to individually map the calculated signal strength of each type of tissue of the human body under the MR model scan sequence to a brightness interval of the MR image, and to determine a tissue to which each pixel point on the MR image obtained by the MRI scan module belongs, according to the mapped signal strength of each type of tissue of the human body under the MR model scan sequence, and to establish an MR model of the patient on the basis of the tissue to which each pixel point on the MR image obtained by the MRI scan module belongs, and a position of the pixel point,
- wherein said MR model establishing processor is configured to operate said MRI scanner with said MR model scan sequence selected from the group consisting of a True Fast Imaging with Steady State Precession (True-FISP) sequence, and a Constructive Interference in Steady State (CISS) sequence, and a Reverse Fast Imaging with Steady State Precession (PSIF) sequence.

12. The apparatus as claimed in claim 11, wherein the MR model establishing processor, before calculating the signal strength of each type of tissue of the human body under the MR model scan sequence, configured to subject an MR image obtained by the MRI scan module to noise removing and contrast enhancement.

* * * * *